United States Patent [19]
Smith

[11] Patent Number: 5,570,398
[45] Date of Patent: Oct. 29, 1996

[54] METHOD AND APPARATUS FOR DYNAMIC POLE-ZERO RECONFIGURATION FOR USE WITH HARD DISC DRIVE SERVOS, ELECTRONIC FILTERS AND OTHER CIRCUITS

[75] Inventor: Robert F. Smith, San Jose, Calif.

[73] Assignee: Seagate Technology, Inc., Scotts Valley, Calif.

[21] Appl. No.: 237,196

[22] Filed: May 2, 1994

[51] Int. Cl.[6] .................................................. H03D 3/24
[52] U.S. Cl. ............................ 375/376; 375/375; 331/17; 331/34; 331/36 R; 327/156
[58] Field of Search .................................. 375/119, 120, 375/371, 373, 374, 375; 331/14, 15, 17, 34, 18, 25, 36 R, 36 C, 36 L, 1 R, 1 A; 327/155, 156, 157, 158, 159, 160, 161, 102

[56] References Cited

U.S. PATENT DOCUMENTS

| | | | |
|---|---|---|---|
| 4,316,152 | 2/1982 | Meyer | 375/376 |
| 4,987,373 | 1/1991 | Soo | 331/14 |
| 5,021,749 | 6/1991 | Kasai et al. | 331/14 |
| 5,061,904 | 10/1991 | Martopoulos et al. | 331/17 |
| 5,173,664 | 12/1992 | Petersen et al. | 331/17 |
| 5,254,955 | 10/1993 | Saeki et al. | 331/17 |
| 5,339,050 | 8/1994 | Llewellyn | 331/17 |

Primary Examiner—Wellington Chin
Assistant Examiner—Huong Luu
Attorney, Agent, or Firm—Flehr, Hohbach, Test, Albritton & Herbert

[57] ABSTRACT

A second order PLL uses on-chip dynamically configurable compensation to permit varying loop bandwidth and damping ratio simultaneously in response to command signals. In a first embodiment, a type 2 PLL is compensated by synthesizing a two-pole lowpass filter, a zero, and a gain-programmable integrator. By appropriate selection of transfer function characteristics associated with each of these three building blocks, the open loop PLL transfer function may be remotely varied by scaling resistance or transconductance. In a second embodiment, a type 2 PLL is compensated using a simple series R-C in parallel with C configuration, wherein component selection results in a transfer function that permits relocation of a zero and a pole by varying a single resistance or transconductance. Such variation is preferably accomplished using ganged banks of resistors, remotely switched by associated metal-on-silicon transistors. In a hard disc data recovery application, wherein the recovered data bit rate varies as a function of read/write head position, generated control signals cause PLL compensation to be dynamically varied as a function of the data bit rate. This permits an optimized bandwidth and damping ratio to remain substantially constant over varying data bit rates. In other frequency agile applications, control signals commanding compensation configuration will be otherwise generated.

19 Claims, 6 Drawing Sheets

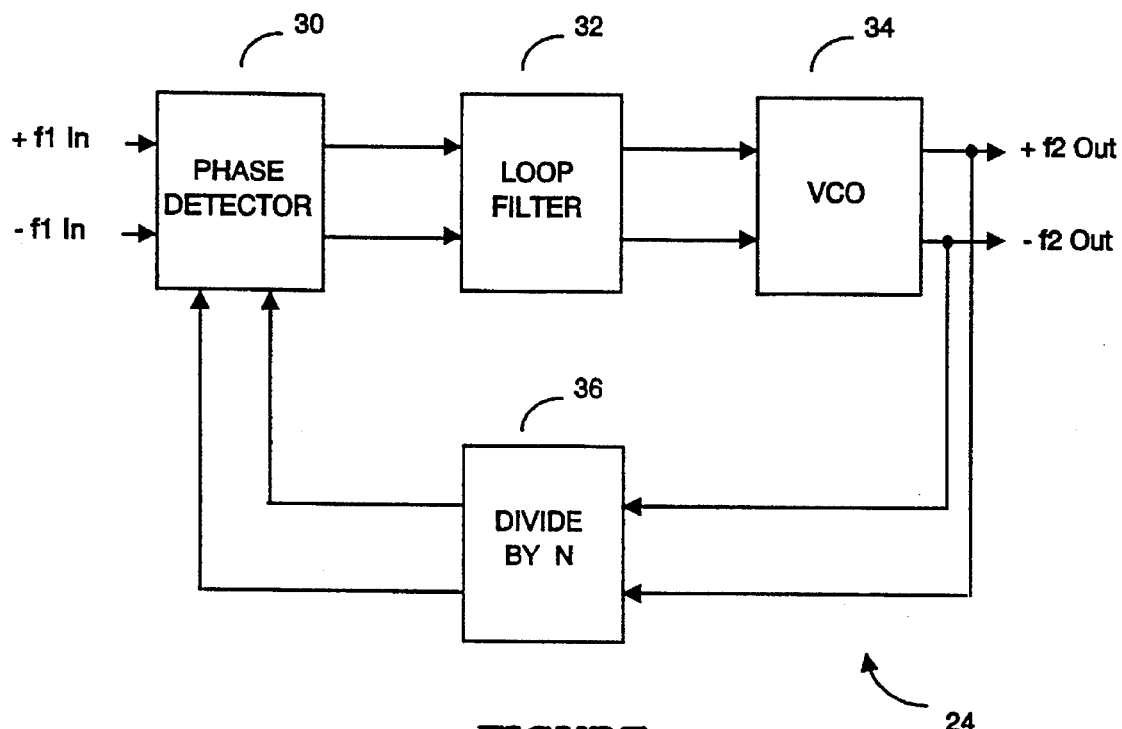
FIGURE 2
(PRIOR ART)
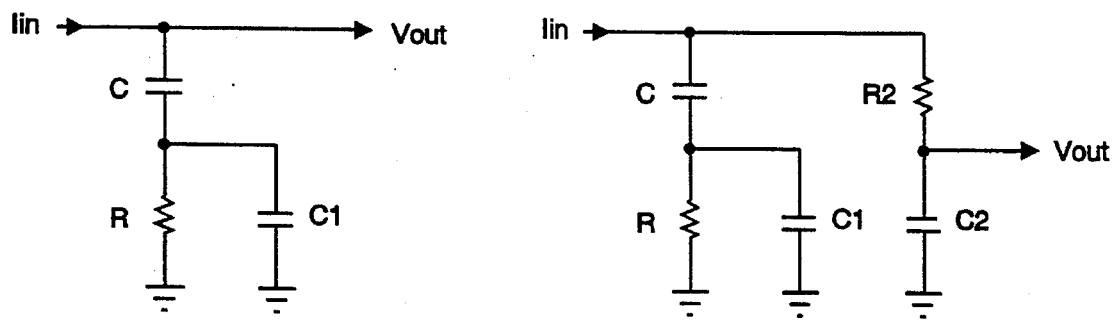
FIGURE 3A
(PRIOR ART)
FIGURE 3B
(PRIOR ART)

METHOD AND APPARATUS FOR DYNAMIC POLE-ZERO RECONFIGURATION FOR USE WITH HARD DISC DRIVE SERVOS, ELECTRONIC FILTERS AND OTHER CIRCUITS

BACKGROUND OF THE INVENTION

The preferred embodiment of the present invention is used for dynamic pole-zero reconfiguration of phase lock loop ("PLL") used to recover data in a hard disc storage system. For that reason, the background of this invention will be described with respect to controlling PLL bandwidth and damping ratio characteristics. However, the present invention may be used to dynamically reconfigure other electronic circuits whose transfer function is affected by repositioning at least one pole and/or a zero.

As shown by FIG. 1, a conventional magnetic disc storage system 2 includes one or more magnetic storage platters or discs 4, 6 that are rotated with velocity ω by a spindle motor 8. Discs 4, 6 have respective upper and lower surfaces 4U, 4L, 6U, 6L upon which data may be magnetically written or read. More specifically, projecting arms of an actuator carriage 10 carry read/write heads (hereafter "heads") 12U, 12L, 14U, 14L that respectively read and/or write data from disc surfaces 4U, 4L, 6U, 6L. Actuator carriage 10 moves all heads radially under command of a positioning servo controller mechanism 16. Of course, assembly 2 is contained in a suitably sealed protective housing (not shown).

The various surfaces of discs 4, 6 are commonly formatted into concentric tracks, T1, T2, T3, etc., portions of which are defined as pie-shaped wedges or sectors, e.g., S1, S2, etc. As such, the various disc storage locations may be defined by disc number (e.g., disc 4), disc surface (e.g., 4U), track (or cylinder) number (e.g., T3) and sector number (e.g., sector S1).

System 2 is coupled to a host computer (not shown). In response to commands issued by users of the host computer, or by a program under execution by the host computer, an appropriate disc drive interface command is issued. For example, such command may require the servo controller 16 to seek data or a storage location on one of the surfaces of a disc, e.g., disc 4, surface 4U, track T3, sector S2.

In response to this command, servo controller 16 actuates carriage 10 in a controlled fashion to move all heads 12U, 12L, 14U, 14L in unison over the disc surfaces until the heads are positioned over the desired target track, T3 in the example at hand. Since all heads on the carriage move together, system 2 includes control circuitry to select the proper read/write head to perform the desired data transfer function, head 12U in the present example. It is expected that system 2 should access data from the target within ten milliseconds or so.

In some storage systems, a dedicated disc surface, surface 4U for example, is provided upon which positional information is permanently pre-recorded for use by servo mechanism 16. More modern storage systems record servo data interspersed with user data, thus avoiding dedication of an entire disc surface to servo signals.

In each system, demodulation of the servo information permits derivation of read/write head position.

As the read/write heads move over the various disc surfaces, a stream of detected or recovered signals is input to a data recovery system 18. Data recovery system 18 includes a clock recovery circuit 20 that typically includes a PLL 24, associated PLL compensation circuitry 26, and toggle circuitry 28. Those skilled in the art will recognize that the data stream provided by the read/write heads is modulated both in frequency and in phase, as a function of the radial position of the read/write heads relative to the disc. Because neither frequency nor phase is known absolutely, it can be difficult to discern at a given moment in time whether the present data stream is useful data, servo data, or garbage.

In conventional clock recovery circuits 20, it is the function of PLL 24 to lock onto the long term average of the recovered data and to generate a series of reference windows in time. The output of PLL 24 as well as the recovered data stream are input to toggle circuitry 28, which typically comprises a series-coupled pair of D-type flipflops. The flipflops toggle with each magnetic transition of the recovered data and the second flipflop is reset with one of the complementary outputs of the PLL 24. As a result, it is possible for the data recovery circuit 18 to output recovered data (to the exclusion of servo data or garbage) to other circuitry, not shown in FIG. 1, for further signal processing by a host computer.

FIG. 2 depicts a typical PLL such as may be used for PLL 24 in FIG. 1. PLL 24 includes a phase detector 30, a loop lowpass filter 32 whose pole-zero characteristics help determine compensation for PLL 24, a voltage controlled oscillator ("VCO") that typically receives current and voltage inputs, and a frequency divider 36. Typically each element in FIG. 2 receives and outputs two signals that are complementary. As is known in the art, phase detector 30 compares input signals f1 to output signals f2/N and outputs a phase error signal that is filtered by loop filter 32 to provide control signals that cause VCO 34 to increase or decrease frequency to minimize the phase error signal. By way of example, if PLL 24 is used to implement a frequency synthesizer, wherein N=10, it is understood that f2 will be ten times the frequency of f1.

Those skilled in the art will recognize that lowpass filter 32 (or other compensation circuit) has an output signal/input signal transfer function that can be represented by the locations of poles and zeroes in the S-plane, where S is the Laplacian transform, $-j\omega$. For example, a transfer function expressed as $T(S)=(S-S1)/(S-S2)$ is said to have a zero at $S=S1$, and a pole at $S=S2$.

The location of the poles and zeroes of the compensation circuit (e.g., filter 32) help determine the bandwidth and damping factor ($\zeta$) of the PLL 24. Ideally, PLL 24 should simultaneously present a large bandwidth during data recovery and a fast recovery or lock time. For example, PLL 24 may have gain and phase characteristics similar to what is shown in either the left-hand or right-hand portion of FIG. 6B.

As noted, PLL performance is affected by the compensation characteristics. FIGS. 3A and 3B depict respectively a simple and a more complex form of type 2 compensation that can be used to compensate a PLL. With reference to FIG. 1, the configuration of 3A or 3B could be used as compensation 26, and with reference to FIG. 2, these configurations could be used as the lowpass loop filter 32.

For the simple compensation configuration of FIG. 3A, the transfer function is given by:

$$\frac{V_{out}}{I_{in}} = \frac{[C+C_1][S+\{1/R[C+C_1]\}]}{[CC_1][S][S+\{1/RC_1\}]}$$

where S is the Laplacian operator, $S=-j\omega$.

While the circuit of FIG. 3A is simple and straightforward, it only provides single pole rolloff for sampling frequency feedthrough and noise. By contrast, the improved type 2 compensation shown in FIG. 3B increases the rejection of sampling frequency feedthrough and noise, but at the expense of additional phase shift.

For the improved 2 compensation configuration of FIG. 3B, the transfer function is given by:

$$T = \frac{V_{out}}{I_{in}} = \frac{[C+C_1][S+\{1/R[C+C_1]\}]}{[CC_1R_2C_2][S][g(s)]}$$

where $g(S) = S^2 + S\{[1/RC_1]+[1/R_2C_2]+[1/R_2C_1]+[1/R_2C]\} + \{[C+C_2]/RR_2CC_1C_2\}$ The above equation for T may be broken down into four component parts as follows:

(a) a gain term, given by:

$$\frac{[C+C_1]}{[CC_1R_2C_2]}$$

(b) a zero located at $S=1/R[C+C_1]$;
(c) a pole located at the origin, (resulting from 1/S); and
(d) a two pole lowpass filter, represented by: $[S^2+S\{[1/RC_1]+[1/R_2C_2]+[1/R_2C_1]+[1/R_2C]\}+\{[C+C_2]/RR_2C_1C_2\}]^{-1}$, which has the form $[S^2+2\zeta\omega_n S+\omega_n^2]^{-1}$.

Unfortunately, as noted, in modern hard disc systems, the recovered data varies in frequency with the radial position of the read/write head. What may be a relatively optimum PLL compensation for data at certain tracks on the hard discs may in fact be detrimental compensation when reading data located at other tracks. Thus, in practice, the PLL gain and damping factors generally are specified for a nominal recovered data frequency and for a compromise gain and damping factor. Typically the resistors R and capacitors C controlling the compensation are discrete components, mounted on a printed circuit board and coupled to an integrated circuit associated with PLL 24.

It is known in the art to vary the PLL compensation by varying open loop gain, but so doing can undesirably alter the PLL damping ratio $\zeta$. One could mitigate the undesired effect upon damping ratio by widely separating the frequency location of the PLL pole and zero. However as the pole-zero span is increased, the high frequency pole contributes less effectively to the desired filtering. In addition, widely separating the pole and zero can result in undesired PLL oscillations if the gain is maintained at too high a magnitude.

In summary, there is a need for a mechanism that permits reconfiguring the pole-zero compensation for a PLL on-the-fly, such that compensation may be dynamically altered to accommodate varying input data frequencies. Preferably such mechanism should be fabricated on the same integrated circuit chip containing the PLL.

The present invention discloses such a system, and a generalized method for implementing its use.

SUMMARY OF THE INVENTION

The present invention provides a second order PLL used in the data recovery portion of a hard disc storage system with a dynamically configurable compensation mechanism. The compensation mechanism may be fabricated as part of the integrated circuit chip containing the PLL.

In a type 2 PLL, compensation is provided in a first embodiment by synthesizing a two-pole lowpass filter, a zero, and a gain-programmable integrator. By appropriate selection of transfer function characteristics associated with each of these three building blocks, the open loop PLL transfer function may be remotely varied by scaling resistance or transconductance.

In a second embodiment, a type 2 PLL is compensated using a simple series R-C in parallel with C configuration, wherein component selection results in a transfer function that permits relocation of a zero and a pole by varying a single resistance or transconductance. Such variation is preferably accomplished using ganged banks of resistors, remotely switched by associated metal-on-silicon transistors.

While the present invention may be used in any frequency agile electronic system, the preferred embodiments are used with a type 2 PLL to recover data from a hard disc memory system. Because the recovered data bit rate varies with the distance of the read/write head from the disc center, the PLL pole-zero compensation is programmably controlled as a function of the digital bit rate. The result is that PLL bandwidth is varied appropriately, but the damping ratio remains substantially unaltered. In this embodiment, read/write head position information is coupled to a microprocessor and associated look-up table that provide proper resistance/transconductance command signals to the PLL compensation.

Other features and advantages of the invention will appear from the following description in which the preferred embodiments have been set forth in detail in conjunction with the accompanying drawings.

BRIEF DESCRIPTION OF THE DRAWINGS

FIG. 2 depicts a conventional phase lock loop feedback system;

FIGS. 3A and 3B depict simple and complex configurations used to compensate a phase lock loop type two system;

DETAILED DESCRIPTION OF THE PREFERRED EMBODIMENTS

The "type" of a PLL is given by the number of poles located at the origin of the open loop transfer function. Because phase is the integral of frequency, by definition a PLL is a minimum of type one. However because PLL utilized in hard disc drives require that the DC phase error be as close to zero as possible, a type 2 PLL is preferred. Phase locked loops greater than type two as a general rule are costly and difficult to stabilize over manufacturing variations. Thus, the present invention is described with respect to a type 2 PLL, although in practice it applies to other than type 2 PLL, (including greater than type 2) and indeed to non-PLL applications.

As noted, it is difficult to optimize a PLL for use with data recovered from a rotating hard disc due to variation in the bit transfer rate as a function of radial distance of the read/write head from the disc center. Thus, the preferred embodiment implements an improved type 2 transfer function PLL whose pole-zero characteristics may be programmably modified on the fly, preferably as a function of the bit transfer rate.

Figure 1:
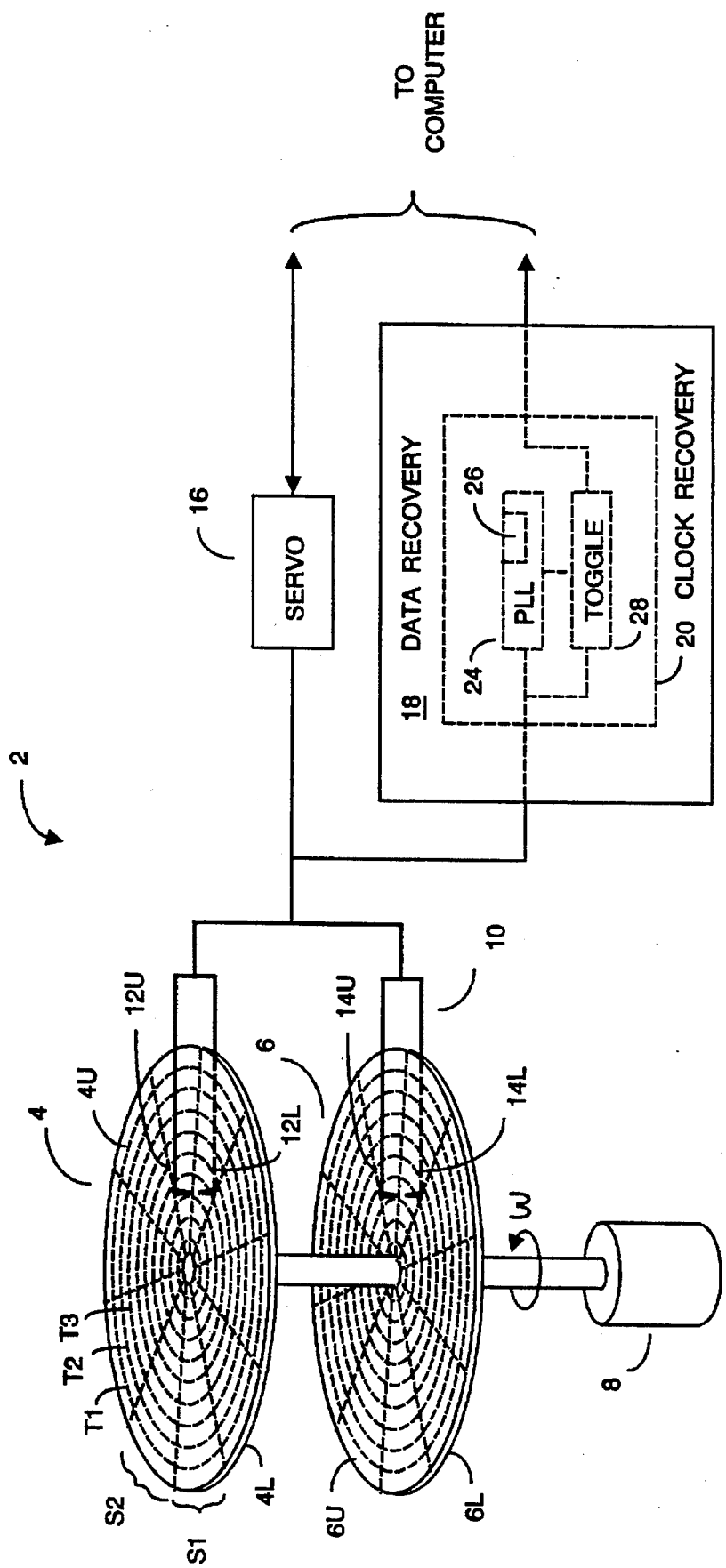
FIG. 1 depicts data recovery from a magnetic disc storage unit, according to the prior art.
Figure 4A:
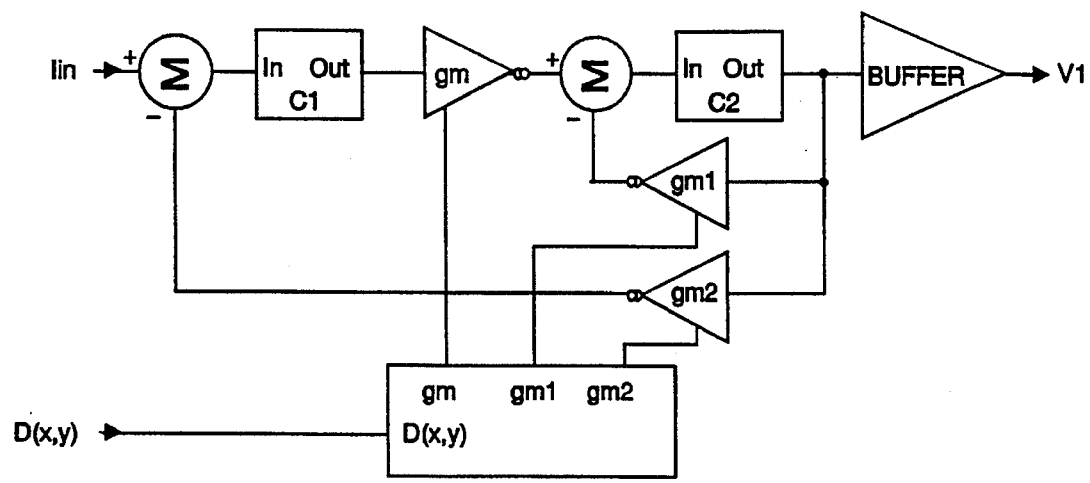
FIG. 4A depicts a programmable two-pole lowpass filter, used to vary compensation in a phase lock loop system, according to the present invention.
Figure 4B:
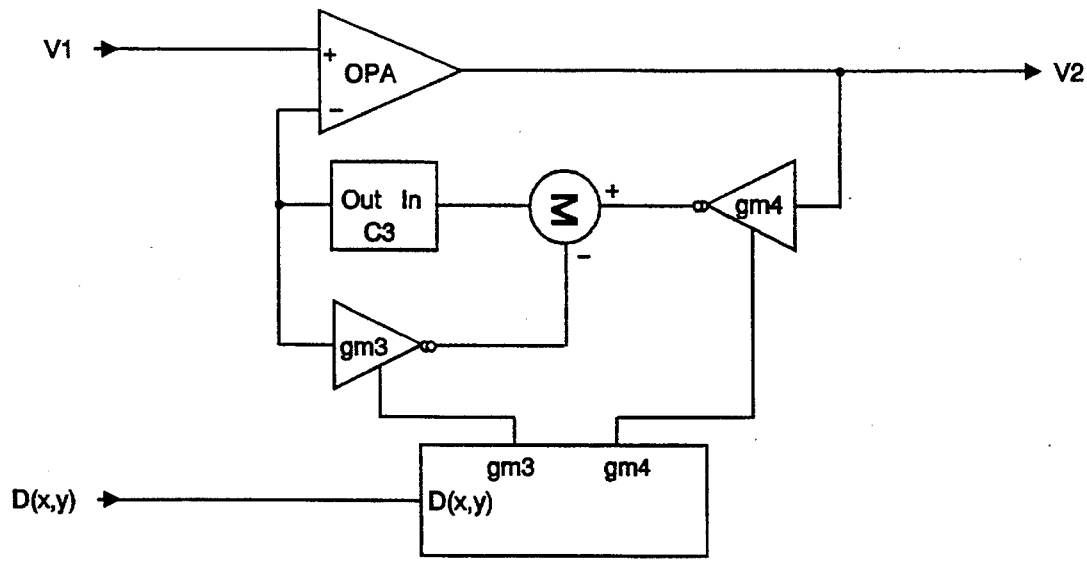
FIG. 4B depicts a programmable zero, used to vary compensation in a phase lock loop system, according to the present invention.
Figure 4C:
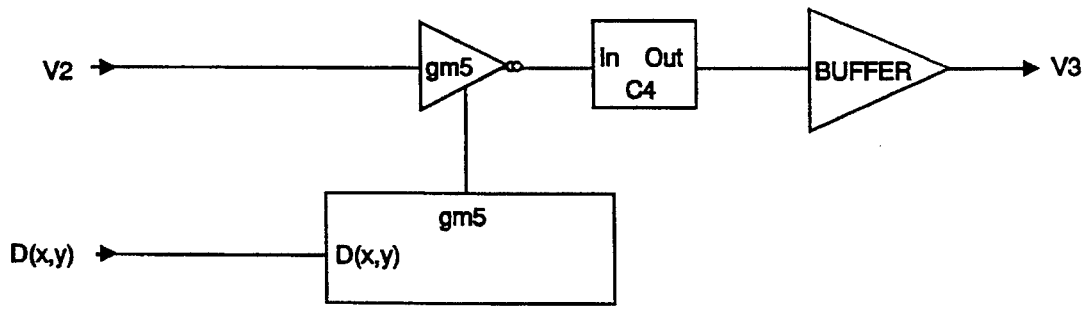
FIG. 4C depicts a programmable gain integrator, used to vary compensation in a phase lock loop system, according to the present invention.
Figure 5:
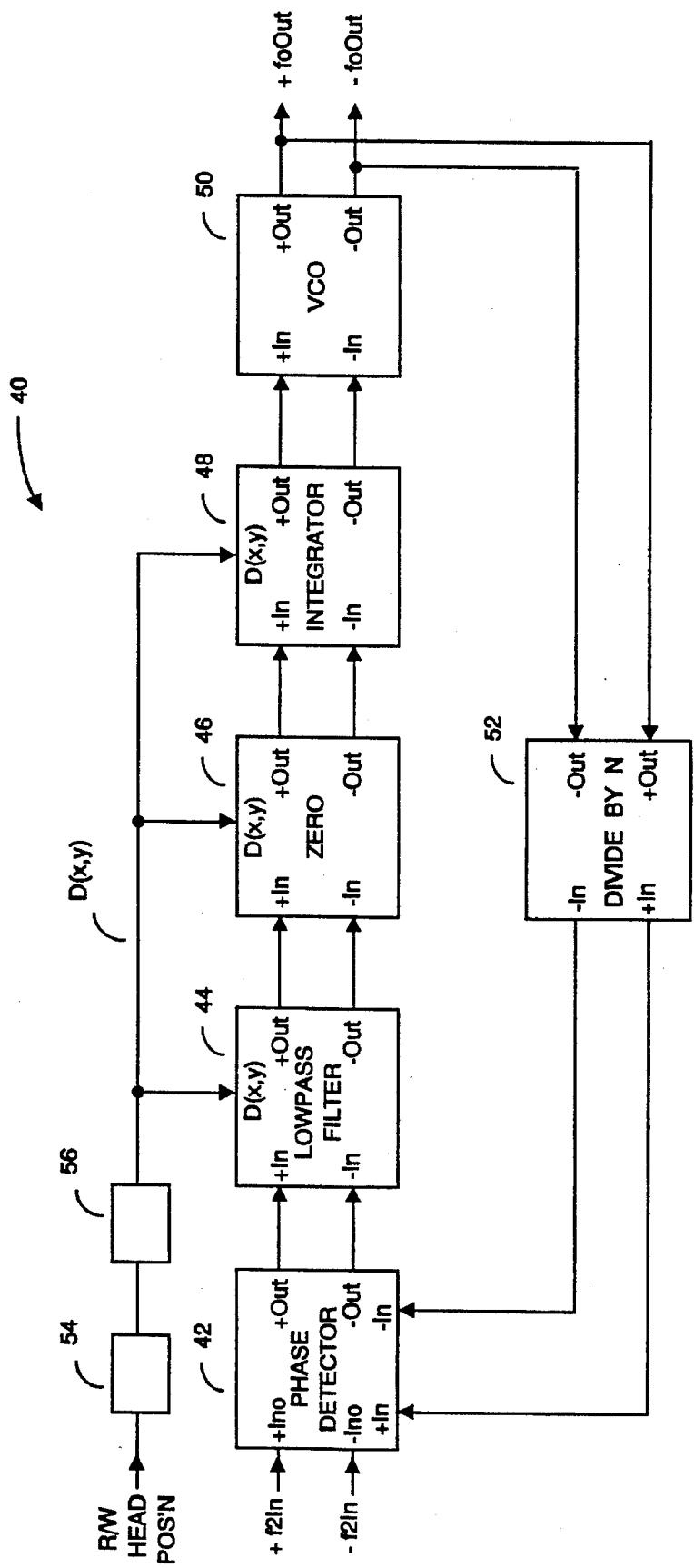
FIG. 5 depicts a first embodiment of a phase lock loop system having programmable compensation, according to the present invention.

FIGS. 4A, 4B and 4C depict respectively a programmable two-pole lowpass filter, a programmable zero, and a programmable gain integrator. These "building blocks" are then combined in a type 2 PLL as shown in FIG. 5 to provide a PLL whose pole-zero characteristics may be reconfigured on the fly in response to digital command signals D(x,y).

As used herein, the nomenclature "D(x,y)" denotes a digital data bus that is x-bits wide, where the least significant bit is y. As shown by FIG. 5, D(x,y) is preferably generated by a microprocessor 54 and an associated look-up table 56, in response to a signal indicating position of the read/write heads relative to the rotating storage discs. Of course in applications not involving data recovery from a hard disc, the control signals D(x,y) may be generated in proportion to other system parameters.

Those skilled in the art of filter design and synthesis will recognize that the configuration of FIG. 4A depicts a two-pole lowpass filter, that receives a current input signal Iin and provides a filtered output voltage V1. The lowpass filter further receives a plurality of binary signals, denoted D(x,y) whose combinations of "1"–"0" patterns can reconfigure the V1/Iin transfer function of the filter, on the fly.

As used herein, the term "gmx" denotes that the input to a given block is multiplied by gmx amperes/volt. The term "Cx" means that the current input to a given block is multiplied by 1/Scx, and that the block output is in volts.

In FIG. 4A, the V1/Iin transfer function of the two-pole lowpass filter depicted is:

$$\frac{V1}{Iin} = \frac{gm}{[C_1 C_2][S^2 + S\{gm_1/C_2\} + gm \, gm_2/C_1 C_2]}$$

If $C_1=C_2=C$, and $gm_2=gm$, it is apparent that:

$$\frac{V1}{Iin} = \frac{gm}{[C^2][S^2 + S(gm_1/C) + gm^2/C^2]}$$

It is seen that $S^2+S\{gm_1/C\}+gm^2/C^2$ is of the form $S^2+2\zeta\omega_n S+\omega_n^2$ where $gm/C=\omega_n$, and $gm_1/C=2\zeta\omega_n=2\zeta gm/C$ In a first preferred embodiment, varying the control signal D(x,y) varies $gm_1$ and $gm_2$, which varies the V1/Iin transfer function of the two-pole lowpass filter configuration shown.

Turning now to FIG. 4B, this block receives an input voltage V1 (which voltage may in fact be the V1 output signal from a lowpass filter such as shown in FIG. 4A), and outputs a voltage V2. In the embodiment shown, the programmable zero configuration also receives the plurality of binary control signals D(x,y), that were described with reference to the programmable filter of FIG. 4A. With reference to FIG. 4B, the D(x,y) combinations of "1"–"0" patterns can reconfigure the V2/V1 transfer function of the zero, on the fly.

The V2/V1 transfer function for the programmable zero of FIG. 4B is given by:

$$\frac{V_2}{V_1} = \frac{C_3 [S + gm_3/C_3]}{gm_4}$$

If $C_3=C$, and $gm_4=gm_3$, it follows that:

$$\frac{V_2}{V_1} = \frac{C[S + gm_3/C]}{gm_3}$$

which gives a zero at $S=gm_3/C$

Turning now to FIG. 4C, this block receives an input voltage V2 (which preferably is the output voltage V2 from the above-described programmable zero). This block integrates V2 as a function of time, and outputs a voltage V3. Further, this block also receives the binary control signals D(x,y), whose combinations of "1"–"0" patterns can reconfigure the V3/V2 transfer function of this programmable integrator, on the fly.

The V3/V2 transfer function of the configuration shown in FIG. 4C is:

$$\frac{V_3}{V_2} = \frac{gm_5}{C_4(S)}$$

FIG. 5 depicts a type 2 programmable PLL 40 according to the present invention. Overall, PLL 40 is somewhat similar to the prior art PLL shown in FIG. 2. Once again, there is a phase detector 42 that receives complementary input signals, here±f2In, having phase±φ$_i$. Phase detector 42 has an associated gain constant K$_p$ (volts/radian).

The phase detector error output signal is presented first to a lowpass filter 44 (preferably implemented using the block shown in FIG. 4A), then to a zero (preferably implemented using the block shown in FIG. 4B), and then to an integrator (preferably implemented using the block shown in FIG. 4C). Collectively blocks 44, 46, and 48 provide compensation for PLL 40.

The filtered signal output by integrator 48 is coupled to the input of VCO 50, which is characterized by a VCO gain constant K$_V$ (radians/volt-second). VCO 50 outputs signals±foOut, whose phase is denoted±φ$_o$, and whose operating frequency is ω$_o$.

The VCO output signals are also coupled as input to a divide-by-N element, which has a gain of 1/N, i.e., a dimensionless pure number. In the preferred embodiment, block 52 is an implied divider, in contrast to dividers associated, for example, with frequency synthesizers, which are physical dividers. The outputs of the 1/N divider are coupled to the phase detector, for comparison with the input signals±f2In.

In contrast to prior art PLLs, it is seen that compensation blocks 44, 46, 48 are coupled to receive control signals D(x,y), which signals permit on the fly configuration of the poles and zeros associated with the lowpass filter 44, the zero 46, and the integrator 48. In further contrast to the prior art, blocks 44, 46, 48 are preferably fabricated as part of the same integrated circuit chip containing PLL 40. Although for ease of illustration FIG. 5 depicts D(x,y) coupled to each of blocks 44, 46, and 48, it is understood that the transfer function associated with each block may be controlled with differing degrees of granularity. Thus, the same number of control bits need not be presented to each of blocks 44, 46 and 48.

With respect to C4, synthesized in integrator block 48, let C4 have a ratio relationship to C, e.g., C4=K$_C$C.

The open loop transfer function $\phi_o/\phi_i$ for PLL 40 shown in FIG. 5 is:

$$\frac{\phi_o}{\phi_i} = \frac{[K_p][K_v]}{[K_c]} \frac{[gm][gm_5][S+gm_3/C]}{[gm_3][C^2][N][S^2][S^2+S(gm1/C)+gm^2/C^2]}$$

From the description of the two-pole lowpass filter of FIG. 4A, $\omega_n = gm/C$. However, the current that determines the VCO operating frequency $\omega_o$ is proportional to K/C, where K is a degree of freedom for the PLL integrated circuit designer. Thus, if gm is derived from the $\omega_o$ determining current, the resultant lowpass filter will automatically compensate for integrated circuit chip-to-chip variations in the value of C. Further, such a lowpass filter will tune itself automatically as $\omega_o$ is varied. Thus, gm controls $\omega_n$.

Further, is also known that $gm_1/C_2\zeta\omega_n = 2\zeta gm/C$, which means that $\zeta = gm_1/2gm$. Thus, if $gm_1 = 2K_Q gm$, it follows that $\zeta = K_Q$. As a result, $\zeta$ will automatically compensate for integrated circuit chip-to-chip variations in C, and will automatically tune itself as $\omega_o$ is varied. Thus, $\zeta$ is independently adjustable and is controlled by $K_Q$.

From the description of the programmable zero depicted in FIG. 4B, it is known that a zero is present at $S = gm_3/C$, and that $\omega_n = gm/C$. If $gm_3 = K_z gm$, the zero will occur at $S = -K_z gm/C = -K_z \omega_n$. Thus, the frequency of the zero will automatically compensate for integrated circuit chip-to-chip variations in the value of C, and will automatically tune itself as $\omega_o$ is varied. Thus, the zero frequency is independently adjustable, and may be controlled by $K_z$.

The value of $gm_5$ may advantageously be used as a control for the overall gain of PLL 40. Making the above-described substitutions, the open loop transfer function $\phi_o/\phi_i$ may now be written as:

$$\frac{\phi_o}{\phi_i} = \frac{[K_p][K_v]}{[K_c][K_z]} \frac{[gm_5][S+K_z gm/C]}{[C^2][N][S^2][S^2+S(2K_Q gm/C)+gm^2/C^2]}$$

In the above equation for $\phi_o/\phi_i$, there will be a desired range of variation for each of the parameters, which ranges will now be described.

As noted with respect to FIG. 4A, lowpass filter 44 may be characterized by gm. Because PLL 40 is preferably used to recover data stored on a rotating magnetic disc, in such application, the highest frequency to which lowpass filter 44 need be tuned will be limited by the bit sampling rate. Given that VCO 50 operates at $\omega_o$, the sampling rate will be $\omega_o/N$ where N is the ratio of divider 52.

In an application involving PLL data recovery from a hard disc system utilizing run length limited ("RLL") coding (1,7), N will be a maximum of 8. On the other hand, in a frequency synthesizer application, the synthesizer output might be programmed to a maximum range of 255, e.g., $2^8$.

Program control over gm should be such that when the maximum $\omega_n$ is programmed, the Nyquist sampling rate is not exceeded. Stated differently, maximum evaluated $\omega_n$ shall be $\phi_o/2N$, where N is the maximum value of N for a data recovery PLL application (or N is the programmed value in a frequency synthesizer PLL application). In the preferred embodiments, the minimum value of $\omega_n$ will be one sixteenth of $\omega_n$ evaluated at maximum, and it will suffice to digitally control gm with a granularity of four bits, provided by control signal D(x,y). Monotocity of $\omega_n$ will be required.

The value of $gm_1$ may also be digitally programmed using four bits, and monotocity of gm1 will be required. In the preferred embodiment, to provide an adequate range for "fine-tuning" the PLL 40 compensation, 0.75 gm$\leq gm_1 \leq$4 gm.

The value of $gm_3$ may also be digitally programmed using four bits, with monotocity required. To provide an adequate adjust range ensuring stability of PLL 40, preferably 0.0625 gm$\leq gm_3 \leq$gm.

The value of $gm_5$ is preferably digitally programmed, although the number of bits need not be four, but monotocity of $gm_5$ is required. Several degrees of freedom exist as $gm_5$ is being utilized to control overall gain. The range of $gm_5$ must be such that under any set of conditions $\phi_o/\phi_i$ can be made to equal one at a frequency $S_o$ where $\omega_n/32 \leq S_o \leq \omega_n/2$.

While the present invention has been described with respect to a type 2 PLL used to recover data from a hard disc storage system, it will be appreciated that the present invention may be used in any application wherein on the fly pole-zero reconfiguration is desired. Such applications may include any frequency agile circuit, for example, compensation of PLLs used in frequency synthesis, reconfiguration of filter characteristics including filters associated with cellular telephones, compensation in any servo system, dynamic alteration of filter characteristics in general.

Figure 6A:
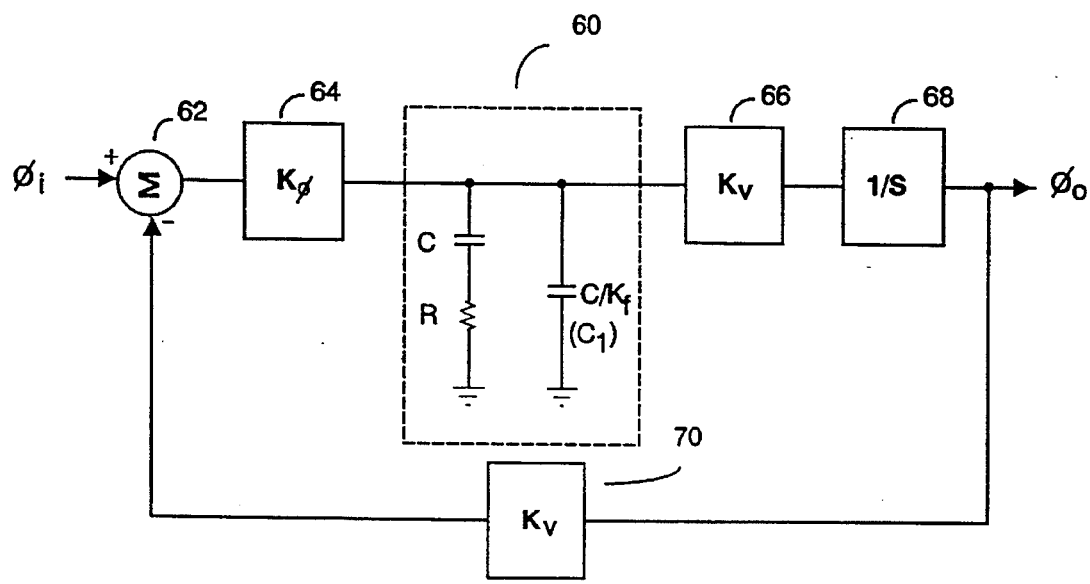
FIG. 6A depicts a second embodiment of a phase lock loop system having programmable compensation, according to the present invention.

FIG. 6A is a block diagram of another preferred embodiment of a PLL, wherein compensation is provided by a parallel RC configuration 60. The phase detector 62 is shown schematically as a summing device whose output is measured in radians. Downstream, element 64 has coefficient $K_\phi$ and converts the radian input to amperes/radian output, which output is presented to the compensation configuration 60.

In FIG. 6A, the compensation block 60 lowpass-filters the amperes/radian input and outputs a voltage signal that is presented to the VCO 66, whose gain is $K_v$ (Hz/volt). The VCO output, measured in Hz, is integrated by element 68, whose output is $\phi_o$, measured in radians. Element 70 presents a 1/N divider to the output signal, and couples the divided output signal to the summer 62, which it is compared to the input signal $\phi_{in}$.

The open loop voltage gain for the PLL configuration of FIG. 6A is given as:

$$Av|_{OL} = \frac{K_\phi K_v K_f[SRC+1]}{S^2 NC[SRC+1+K_f]}$$

It is seen that the open loop gain $A_v$ has a zero at $S = -1/RC$, and has poles at $S = 0$, $S = 0$, and at $S = -(1+K_f)/RC$. If we let $\omega_z = 1/RC$, and let $\phi_{p3} = (1+K_f)/RC$, it follows that $RC = 1/\omega_z = (1+Kf)/\omega_{p3}$. Thus, $\omega_{p3} = (1+Kf)\omega_z$, which is simply the ratio of the two capacitors shown in FIG. 6A.

It is significant from that above that a variation in R will move $\omega_z$ and $\omega_{p3}$ together, as a pair. Thus, the open loop voltage gain $A_v$ may be written:

$$Av|_{OL} = \frac{K_\phi K_v K_f[S+\omega_z]}{S^2 NC[S+\omega_p]} = \left[\frac{K_\phi K_v K_f}{S^2 NC}\right]\left[\frac{S+\omega_z}{S+\omega_{p3}}\right]$$

Those skilled in the art will recognize that, when represented by a log-log plot of $A_v$ versus $\omega$, the resultant graph of open loop $A_v$ is a line having slope=-2 passing, at $\omega=1$ (assuming $\omega_z >> 21$) through the point $(K_\phi K_v K_c)/(NC)$. At $\omega = \omega_z$, the slope would modify to -1, and would return to slope -2 at $\omega = \omega_{p3}$ for $\omega_{p3} >> \omega_z$.

With respect to the phase of the open loop gain $A_v$, for $\omega_z >> \omega$, the phase will be 180° as is the case for $\omega >> \omega_{p3}$. The effect of $\omega_z$ is to provide +90° of phase, 45° of which is present at frequency $\omega_z$. The effect of $\omega_{p3}$ is to provide -90° of phase shift, of which -45° is present at frequency $\omega_{p3}$.

Thus, it is apparent that the phase departure from -180° is a function of $K_f$, e.g., if $K_f = 0$, $\omega_z = \omega_{p3}$, whereupon the phase of the open loop $A_v$ will remain at $-180°$. On the other hand, if $\omega_{p3} \gg \omega_z$ (e.g., $K_f > 10$), then the open loop $A_v$ phase will be $-180°$ for $\omega \ll \omega_z$, $-135°$ at $\omega_z$, continuing to change to $-90°$ for $\omega \gg 12\omega_z$, reducing to $-135°$ at $\omega = \omega_{p3}$, and continuing to $-180°$ for $\omega \gg \omega_{p3}$. Thus, the phase of the open loop gain $A_v$ has a "bump", whose frequency position is controlled by $\omega_z$ and whose amplitude is controlled by $K_f$.

The closed loop gain $A_v$ for the PLL of FIG. 6A may be written as follows:

$$Av|_{CL} = \frac{K_\phi K_v K_f N(S+\omega_z)}{NCS^2[S+\omega_{p3}] + k_\phi K_v K_f[S+\omega_z]}$$

The above expression may be simplified by removing the high frequency pole, which results in:

$$Av|_{CL} = \frac{K_\phi K_v K_f N(S+\omega_z)}{NCS^2 + SK_\phi K_v K_f + K_\phi K_v K_f \omega_z} =$$

$$\frac{\frac{K_v K_\phi K_f}{C}[S+\omega_z]}{S^2 + S\frac{K_\phi K_v K_f}{NC} + \frac{K_\phi K_v K_f \omega_z}{NC}}$$

The denominator is seen to have the form $S^2 + 2\zeta\omega_n S + \omega_n^2$, from which it follows the following equations follows:

$$\omega_n = \frac{\sqrt{K_\phi K_v K_f \omega_z}}{NC} = \frac{\sqrt{K_\phi K_v K_f}}{NRC^2} = \frac{1}{C}\sqrt{\frac{K_\phi K_f K_v}{RN}}$$

$$2\zeta\omega_n = \frac{2\zeta}{C}\sqrt{\frac{K_q K_f K_v}{RN}} = \frac{K_\phi K_v K_f}{NC}$$

$$\zeta = \frac{1}{2}\frac{\sqrt{K_\phi K_v K_f R}}{N}$$

From the above equations, it is clear that varying a resistance R (or transconductance, or the synthesized equivalent of resistance or transconductance) will simultaneously vary $\omega_n$ and the damping characteristic $\zeta$. Of course, R may be varied, without limitation, using remotely switchable resistor banks, varying field effect source-drain impedance, providing transconductance amplifiers, and the like.

Figure 6B:
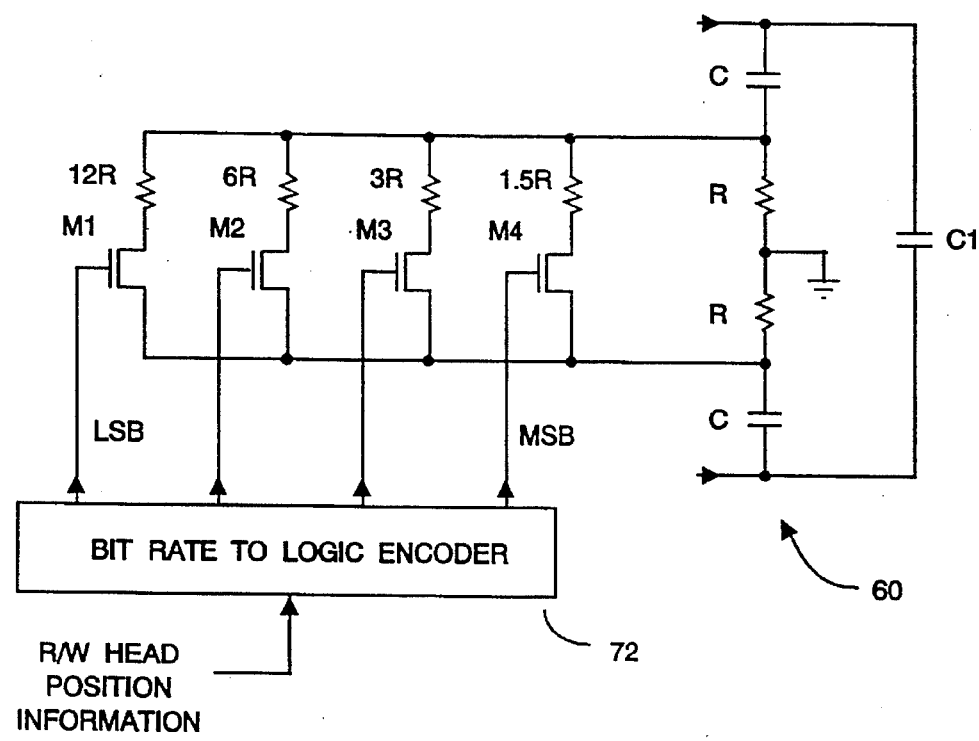
FIG. 6B depicts a preferred mechanism for varying the compensation characteristics of the PLL of FIG. 6A, according to the present invention.

FIG. 6B, for example, shows a preferred mechanism for varying R (and thus for simultaneously varying $\omega_z$ and $\omega_{p3}$, e.g., $\omega_n$ and $\zeta$). The effective impedance Z of the RC-C1 combination is given by $Z=(1+SRC)/[(S)(SRCC_1+C+C_1)]$. This transfer function, Z, has a zero at $S=1/RC$, a pole at $S=0$, and a second pole at $S=-(C+C_1)/(RCC_1)$. Thus, the zero and the second pole are inversely proportional to R. As a result, if R is varied, both the zero and the second pole are moved, the pole tracking the zero.

In FIG. 6B, R is varied with a granularity of $2_4=16$, although fewer or more control bits could be used to provide a different granularity of adjustment. In FIG. 6B, if the least significant bit ("LSB") is "1" and the other control bits are zero, only transistor M1 turns on, shunting the fixed resistors R with 12R, to provide a relatively small change in R. On the other hand, if the most significant bit ("MSB") is "1" and the other control bits are "0", only M4 is turned on, shunting the fixed resistors R with 1.5 R, to produce a substantial change in effective resistance. Of course, if all control bits are off, essentially no effective resistance is shunted across the fixed resistors R, and if all control bits are on, four resistors are shunted.

In the described hard disc data recovery system, those skilled in the art will appreciate that errors can occur if input data provided to the PLL is sampled with a phase error exceeding $\pi$ radians. The present invention has been invested with respect to use in recovering data encoded into a hard disc using run-length-limited ("RLL") format, 1,7 protocol, wherein the input data bit rate varied from about 20 Mbps to about 60 Mbps. By employing zero phase restart, the effects of environmental variables were substantially reduced, which provides a greater error budget for the read/write head window. In this embodiment, PLL lock was achieved within three periods of the data code clock. The phase restart error was assumed to be 0.5 radians (maximum) plus an assumed $6\sigma$ maximum noise error of $\pi/2$ radians. This figure was further reduced by an ISI 48-clock code period:

$$\frac{\pi/2 + 0.5 - \pi/4}{\pi/2 + 0.5} = 0.62$$

which implies a 38% reduction, a requirement readily satisfied for any angle within $\omega_n t = 1$. Thus:

$$\omega_n(3)(3)(16)/(2F_d) < 1, \quad \omega_n > 0.014 F_d$$

where $F_d$ is the non-return-zero ("NRZ") data bit rate. If $K_f = 5$, the phase "bump" of the transfer function will be 45° at the peak value. If $R = K_x/\sqrt{F_d}$, and $K_\Phi = K_y N/\sqrt{F_d}$, then as the bit rate $F_d$ varies, the quotient $\omega_n/F_d$ will be constant, where $K_x$ and $K_y$ are constants.

In FIG. 6B, a bit rate to logic encoder block 72 is shown. This block may include a microprocessor and look-up table, as in the embodiment of FIG. 5, or may include another mechanism whereby the D(x,y) control bits are dynamically varied in response to the position of the read/write heads over the rotating discs. Of course, in a non-hard disc application, the D(x,y) control signals could be generated in other ways.

Figure 7A:
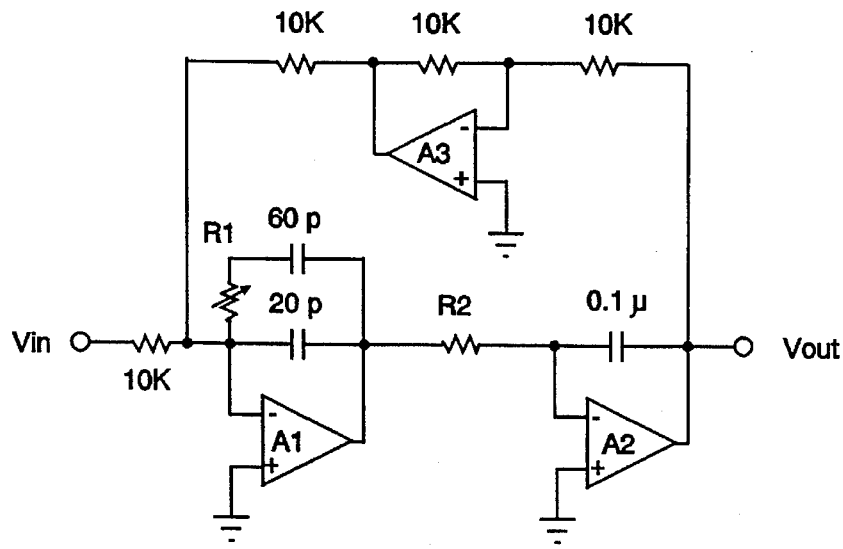
FIG. 7A depicts components controlled by a variable resistor for altering compensation, according to the present invention.
Figure 7B:
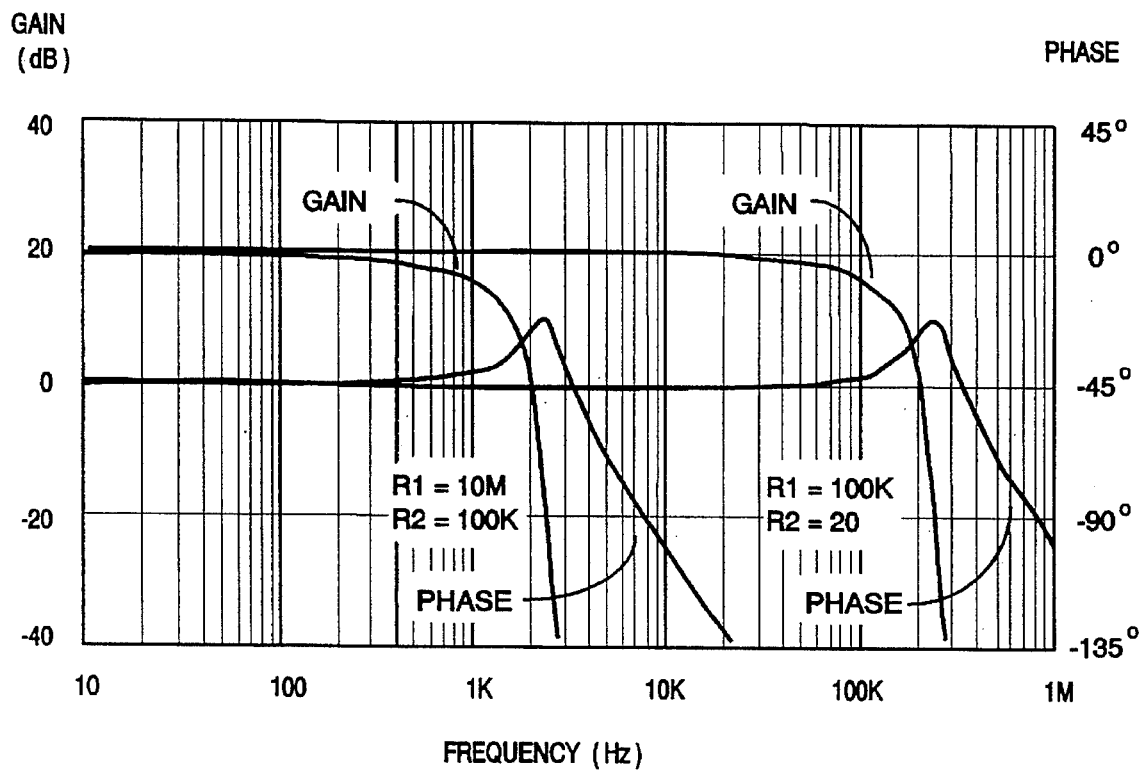
FIG. 7B depicts gain and phase characteristics for the components of FIG. 7A.

FIG. 7A depicts yet another compensation configuration, wherein varying resistors R1 and R2 advantageously permits an increase in bandwidth (e.g., the right hand portion of FIG. 7B), while maintaining a constant damping factor (depicted by the consistency of the phase curve shape). In practice, the resistors R1, R2 may be remotely controlled, for example using a ganged resistor-field effect transistor array as per FIG. 6B, or by other techniques known to those skilled in the art.

In each of the various described embodiments, a relatively optimized relationship between PLL bandwidth and damping ratio is maintained, despite a dynamic range of input frequencies.

Modifications and variations may be made to the disclosed embodiments without departing from the subject and spirit of the invention as defined by the following claims.

What is claimed is:

1. A continuous programmable phase lock loop system, comprising:

detector means for comparing a characteristic between an input signal and a feed-back signal and for generating a difference output signal in response to a characteristic difference therebetween;

variable oscillator means for outputting said feed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal, wherein said compensation means includes at least one element selected from the group consisting of (i) a programmable two-pole low pass filter at least one pole of which varies in location in response to said control signal, (ii) a programmable zero whose position varies in response to said control signal, and (iii) a gain-programmable integrator whose gain varies in response to said control signal.

2. The system of claim 1, wherein said detector means, said variable oscillator means and said compensation means are fabricated on a common integrated circuit chip.

3. A continuous programmable phase lock loop system, comprising:

detector means for comparing a characteristic between an input signal and a feed-back signal and for generating a difference output signal in response to a characteristic difference therebetween;

variable oscillator means for outputting said feed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal, wherein said compensation means includes a programmable two-pole low pass filter whose output voltage/input current transfer function is given by:

$$\frac{V1}{Iin} = \frac{gm}{[C^2][S^2 + S(gm_1/C) + gm^2/C^2]}$$

wherein $gm/C = \omega_n$, $gm_1/C = 2\zeta\omega_n = 2\zeta gm/C$, wherein $\omega_n$ and $\zeta$ represent natural frequency and damping ratio for said system, and wherein at least one of said $gm$ and $gm_1$ are variable in response to said control signal.

4. A continuous programmable phase lock loop system, comprising:

detector means for comparing a characteristic between an input signal and a feed-back signal and for generating a difference output signal in response to a characteristic difference therebetween;

variable oscillator means for outputting said feed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal, wherein said compensation means has a transfer function that includes at least one zero and at least one pole, which zero and pole simultaneously vary in location in response to said control signal.

5. A continuous programmable phase lock loop system, comprising:

detector means for comparing a characteristic between an input signal and a feed-back signal and for generating a difference output signal in response to a characteristic difference therebetween;

variable oscillator means for outputting said feed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal, wherein said compensation means has a transfer function and includes a first capacitor coupled in parallel with a series string comprising a second capacitor and a real impedance;

wherein said real impedance varies in response to said control signal causing a zero and a pole in said compensation means's transfer function to vary in position.

6. A continuous programmable phase lock loop system, comprising:

detector means for comparing a characteristic between an input signal and a feed-back signal and for generating a difference output signal in response to a characteristic difference therebetween;

variable oscillator means for outputting said feed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal, wherein said system has a damping factor, and wherein said compensation means varies bandwidth of said system in response to said control signal, without substantially altering said system's damping factor.

7. The system of claim 6, wherein said detector means includes a phase detector.

8. The system of claim 6, further including means for generating said control signal.

9. The system of claim 6, wherein said system is at least type 2.

10. A monolithic continuous phase lock loop system for use in recovering variable bit rate data from a hard disc system, comprising:

detector means for comparing a characteristic between an input signal representing said variable bit rate data and a fed-back signal and for generating a difference output signal in response to a characteristic difference therebetween;

variable oscillator means for outputting said fed-back signal in response to an oscillator input signal proportional to said difference output signal; and non-sampled compensation means, coupled to receive said difference output signal from said detector means and to provide said oscillator input signal to said variable oscillator means, for altering at least one characteristic of said phase lock loop system in response to a control signal;

wherein said control signal varies in response to variation in said bit rate data.

11. The system of claim 10, wherein said compensation means includes at least one element selected from the group consisting of (i) a programmable two-pole low pass filter at least one pole of which varies in location in response to said control signal, (ii) a programmable zero whose position varies in response to said control signal, and (iii) a gain-programmable integrator whose gain varies in response to said control signal.

12. The system of claim 11, wherein said compensation means includes a programmable two-pole low pass filter whose output voltage/input current transfer function is given by:

$$\frac{V1}{Iin} = \frac{gm}{[C^2][S^2 + S(gm_1/C) + gm^2/C^2]}$$

wherein $gm/C=\omega_n$, $gm_1/C=2\zeta gm/C$, wherein $\omega_n$ and $\zeta$ represent natural frequency and damping ratio for said system, and wherein at least one of $gm$ and $gm_1$ are variable in response to said control signal.

13. The system of claim 10, wherein said compensation means has a transfer function that includes at least one zero and at least one pole, which zero and pole simultaneously vary in location in response to said control signal.

14. The system of claim 10, wherein said compensation means has a transfer function and includes a first capacitor coupled in parallel with a series string comprising a second capacitor and a real impedance;

wherein said real impedance varies in response to said control signal causing a zero and a pole in said compensation means's transfer function to vary in position.

15. The system of claim 11, wherein said compensation means includes at least a second impedance, switchably coupleable in parallel with a first impedance in response to said control signal.

16. The system of claim 11, wherein said system has a damping factor and wherein said compensation means varies bandwidth of said system in response to said control signal, without substantially altering said system's damping factor.

17. The system of claim 10, wherein said detector means includes a phase detector.

18. The system of claim 10, further including means for generating said control signal, wherein said control signal includes a plurality of digital bits.

19. The system of claim 10, wherein said system is at least type 2.

* * * * *